(12) United States Patent
Yuan

(10) Patent No.: US 11,362,313 B2
(45) Date of Patent: Jun. 14, 2022

(54) MANUFACTURING METHOD AND PROCESSING DEVICE FOR DISPLAY SUBSTRATE EACH APPLYING MAGNETIC FIELD DURING AGING CURRENT BEING GENERATED

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: De Yuan, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 149 days.

(21) Appl. No.: 16/652,317

(22) PCT Filed: Mar. 27, 2019

(86) PCT No.: PCT/CN2019/079869
§ 371 (c)(1),
(2) Date: Mar. 30, 2020

(87) PCT Pub. No.: WO2020/191662
PCT Pub. Date: Oct. 1, 2020

(65) Prior Publication Data
US 2021/0242435 A1 Aug. 5, 2021

(51) Int. Cl.
*H01L 51/56* (2006.01)
*H01L 51/00* (2006.01)
*H01L 27/32* (2006.01)

(52) U.S. Cl.
CPC .......... *H01L 51/56* (2013.01); *H01L 51/0031* (2013.01); *H01L 27/3244* (2013.01); *H01L 2227/323* (2013.01); *H01L 2251/562* (2013.01)

(58) Field of Classification Search
CPC . H01L 51/56; H01L 51/0031; H01L 27/3244; H01L 27/22
See application file for complete search history.

(56) References Cited

U.S. PATENT DOCUMENTS

| 2016/0212807 | A1* | 7/2016 | Eberson | H05B 45/3725 |
| 2018/0356920 | A1* | 12/2018 | Liu | H01L 27/1262 |
| 2019/0006595 | A1* | 1/2019 | Xu | H01L 51/0031 |
| 2019/0013491 | A1* | 1/2019 | Chen | C09K 11/06 |

FOREIGN PATENT DOCUMENTS

| CN | 101153886 A | 4/2008 |
| CN | 106250641 A | 12/2016 |
| JP | 2006116768 A | 5/2006 |
| JP | 2007258275 A | 10/2007 |

* cited by examiner

*Primary Examiner* — Michael Jung
(74) *Attorney, Agent, or Firm* — The Webb Law Firm

(57) ABSTRACT

The present disclosure provides a manufacturing method and a processing device for a display substrate. The display substrate includes a light emitting device. The manufacturing method includes: applying an electrical signal to the display substrate to generate aging current flowing through the light emitting device; and applying a magnetic field to the display substrate for at least part of a time, during which the electrical signal is applied to the display substrate. The magnetic field is used to increase the aging current.

19 Claims, 8 Drawing Sheets

MANUFACTURING METHOD AND PROCESSING DEVICE FOR DISPLAY SUBSTRATE EACH APPLYING MAGNETIC FIELD DURING AGING CURRENT BEING GENERATED

CROSS-REFERENCE TO RELATED APPLICATION

This application is the United States national phase of International Application No. PCT/CN2019/079869 filed Mar. 27, 2019, the disclosures of which is hereby incorporated by reference in its entirety.

TECHNICAL FIELD

The present disclosure relates to a manufacturing method and a processing device for a display substrate.

BACKGROUND

AMOLED (Active-matrix organic light-emitting diode), as a new generation of display technology, has achieved great development and has been successfully commercialized due to its advantages such as high contrast, wide color gamut and foldability. However, AMOLED still has some shortcomings. For example, AMOLED uses organic materials as main functional layers so that its products have a problem of low service life. In order to improve the user experience, it is particularly important to increase the service life of OLED products.

At present, in order to increase the service life of AMOLED products, a Lifetime-Aging (also referred to as L-Aging) method can be used.

SUMMARY

According to an aspect of embodiments of the present disclosure, a manufacturing method for a display substrate is provided. The display substrate comprises a light emitting device. The manufacturing method comprises: applying an electrical signal to the display substrate to generate aging current flowing through the light emitting device: and applying a magnetic field to the display substrate for at least part of a time, during which the electrical signal is applied to the display substrate, the magnetic field being used to increase the aging current.

In some embodiments, magnetic induction intensity of the magnetic field ranges from 20 mT to 400 mT.

In some embodiments, the applying of the magnetic filed to the display substrate comprises: obtaining magnetic induction intensity of the magnetic field to be applied to the display substrate; and applying the magnetic field to the display substrate according to the magnetic induction intensity.

In some embodiments, the obtaining of the magnetic induction intensity of the magnetic field to be applied to the display substrate comprises: obtaining a relation curve between magnetic induction intensity of a magnetic field to be applied to the light emitting device and current flowing through the light emitting device; and obtaining the magnetic induction intensity of the magnetic field to be applied to the display substrate according to the relation curve.

In some embodiments, the display substrate further comprises a driving thin film transistor, a first electrode of the driving thin film transistor being electrically connected to a first voltage terminal for providing a first voltage, and a second electrode of the driving thin film transistor being electrically connected to a first electrode of the light emitting device, a gate of the driving thin film transistor being configured to receive a gate voltage, and a second electrode of the light emitting device being electrically connected to a second voltage terminal for providing a second voltage; and the applying of the electrical signal to the display substrate comprises: applying the first voltage to the first voltage terminal, applying the second voltage to the second voltage terminal, and applying the gate voltage to the gate of the driving thin film transistor; wherein an absolute value of a difference between the gate voltage and the first voltage is inversely related to magnetic induction intensity of the magnetic field.

In some embodiments, the first voltage is higher than the second voltage in a case where the driving thin film transistor is a PMOS transistor; the first voltage is lower than the second voltage in a case where the driving thin film transistor is an NMOS transistor.

In some embodiments, the absolute value of the difference between the gate voltage and the first voltage ranges from 1V to 10V.

In some embodiments, a duration of applying the electrical signal is inversely related to magnetic induction intensity of the magnetic field.

In some embodiments, the manufacturing method further comprises: performing a packaging process on the display substrate before applying the electrical signal to the display substrate; and performing a module process on the display substrate after applying the electrical signal to the display substrate.

According to another aspect of embodiments of the present disclosure, a processing device for a display substrate is provided. The display substrate comprises a light emitting device. The processing device comprises: an electric signal applying device configured to apply an electrical signal to the display substrate to generate aging current flowing through the light emitting device; and a magnetic field generating device configured to apply a magnetic field to the display substrate for at least part of a time, during which the electrical signal applying device applies the electrical signal to the display substrate, the magnetic field being used to increase the aging current.

In some embodiments, the magnetic field generating device comprises at least one magnetic field device plate for generating the magnetic field.

In some embodiments, the at least one magnetic field device plate comprise a first magnetic field device plate and a second magnetic field device plate, wherein the electric signal applying device is located between the first magnetic field device plate and the second magnetic field device plate.

In some embodiments, the first magnetic field device plate comprises a first coil, and the second magnetic field device plate comprises a second coil; wherein the first coil and the second coil generate the magnetic field after being energized.

In some embodiments, the magnetic field generating device is configured to adjust magnetic induction intensity of the magnetic field applied to the display substrate by adjusting a magnitude of current flowing through the first coil and a magnitude of current flowing through the second coil.

In some embodiments, a plane on which the first magnetic field device plate is located is parallel to a plane on which the second magnetic field device plate is located.

In some embodiments, the processing device further comprises: a stage configured to support the display substrate, wherein the electrical signal applying device is integrated on the stage.

In some embodiments, the first magnetic field device plate is above the stage, and the second magnetic field device plate is below the stage; a plane on which the first magnetic field device plate is located is parallel to a plane on which a supporting surface of the stage is located, and a plane on which the second magnetic field device plate is located is parallel to the plane on which the supporting surface of the stage is located.

In some embodiments, the first magnetic field device plate is on a left side of the stage, and the second magnetic field device plate is on a right side of the stage; a plane on which the first magnetic field device plate is located is perpendicular to a plane on which a supporting surface of the stage is located, and a plane on which the second magnetic field device plate is located is perpendicular to a plane on which the supporting surface of the stage is located.

In some embodiments, a distance between the first magnetic field device plate and the second magnetic field device plate ranges from 30 cm to 100 cm.

In some embodiments, a distance between the stage and the first magnetic field device plate is equal to a distance between the stage and the second magnetic field device plate.

Other features and advantages of the present disclosure will become apparent from the following detailed description of exemplary embodiments of the present disclosure with reference to the accompanying drawings.

BRIEF DESCRIPTION OF THE DRAWINGS

The accompanying drawings, which constitute part of this specification, illustrate exemplary embodiments of the present disclosure and, together with this specification, serve to explain the principles of the present disclosure.

The present disclosure may be more clearly understood from the following detailed description with reference to the accompanying drawings, in which.

Figure 1A:
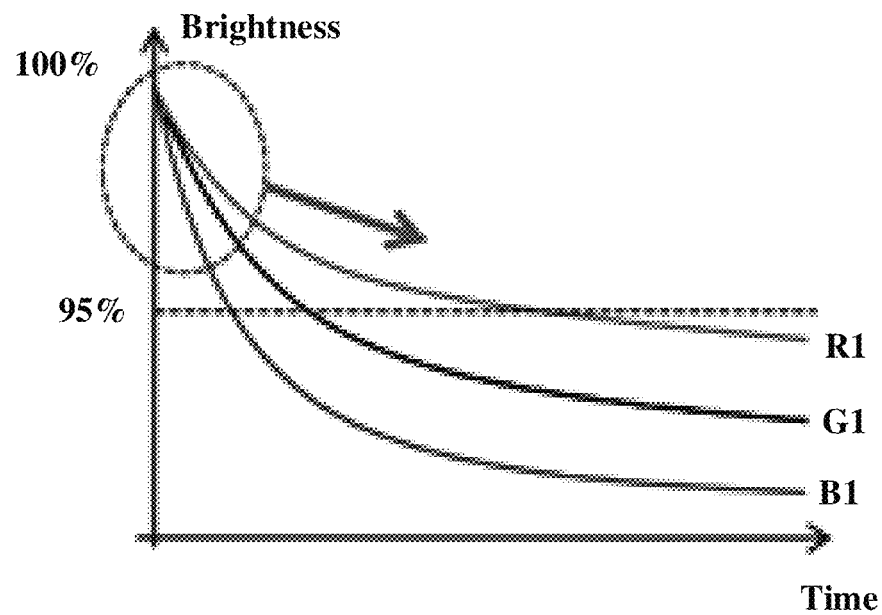
FIG. 1A shows a lifetime curve effect diagram of a display substrate without performing a lifetime aging method according to some embodiments.

It should be understood that the dimensions of the various parts shown in the accompanying drawings are not necessarily drawn according to the actual scale. In addition, the same or similar reference signs are used to denote the same or similar components.

DETAILED DESCRIPTION

Various exemplary embodiments of the present disclosure will now be described in detail with reference to the accompanying drawings. The description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "include" or the like means that the element before the word covers the element (s) listed after the word without excluding the possibility of also covering other elements. The terms "up", "down", "left", "right", or the like are used only to represent a relative positional relationship, and the relative positional relationship may be changed correspondingly if the absolute position of the described object changes.

In the present disclosure, when it is described that a particular device is located between the first device and the second device, there may be an intermediate device between the particular device and the first device or the second device, and alternatively, there may be no intermediate device. When it is described that a particular device is connected to other devices, the particular device may be directly connected to said other devices without an intermediate device, and alternatively, may not be directly connected to said other devices but with an intermediate device.

All the terms (comprising technical and scientific terms) used in the present disclosure have the same meanings as understood by those skilled in the art of the present disclosure unless otherwise defined. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

Figure 1B:
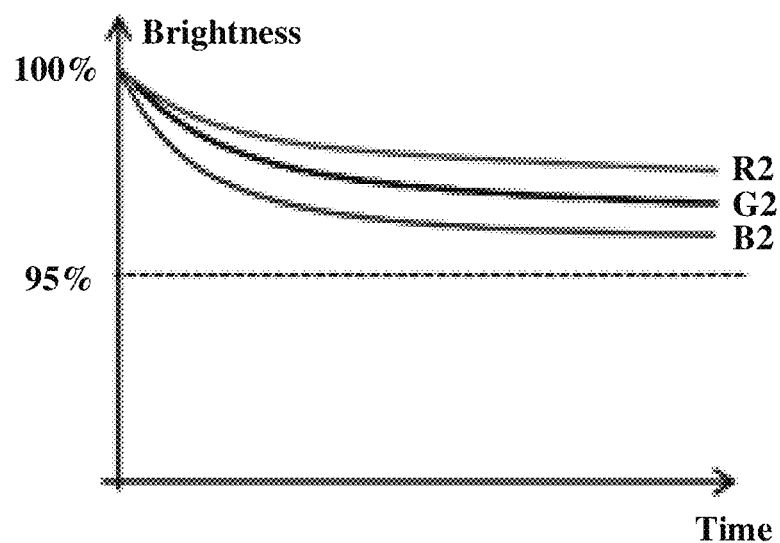
FIG. 1B shows a lifetime curve effect diagram of a display substrate after performing a lifetime aging method according to some embodiments.

FIG. 1A shows a lifetime curve effect diagram of a display substrate without performing a lifetime aging method according to some embodiments. FIG. 1B shows a lifetime curve effect diagram of a display substrate after performing a lifetime aging method according to some embodiments.

For example, the lifetime of AMOLED generally refers to how quickly its brightness decays over time. Generally, the lifetime can be expressed by LT95, that is, the time required for the brightness to decrease to 95%. A brightness decay curve of an OLED generally shows a trend that the brightness decays rapidly at first and then decays slowly, as shown in FIG. 1A.

The principle of the lifetime aging (L-Aging) method is to apply a large current for a short time (for example, 10 minutes to 30 minutes) to a light emitting device (such as an OLED device) of a display substrate, so that defects inside the device tend to be saturated in the short time. Therefore, a rapid attenuation portion of a initial brightness of the light emitting device is removed before the product leaves the factory. The portion within the circle in FIG. 1A is the rapid attenuation portion of the initial brightness of the light emitting device. From the comparison between FIG. 1A and FIG. 1B, after performing the lifetime aging method, the rapid attenuation portion of the initial brightness of the light emitting device is removed, so that the LT95 lifetime of the product is greatly improved.

The inventors of the present disclosure have found that the above lifetime aging method may affect the product characteristics of the display substrate. The specific analysis is as follows.

In some embodiments, the display substrate further comprises at least one driving thin film transistor.

Figure 2A:
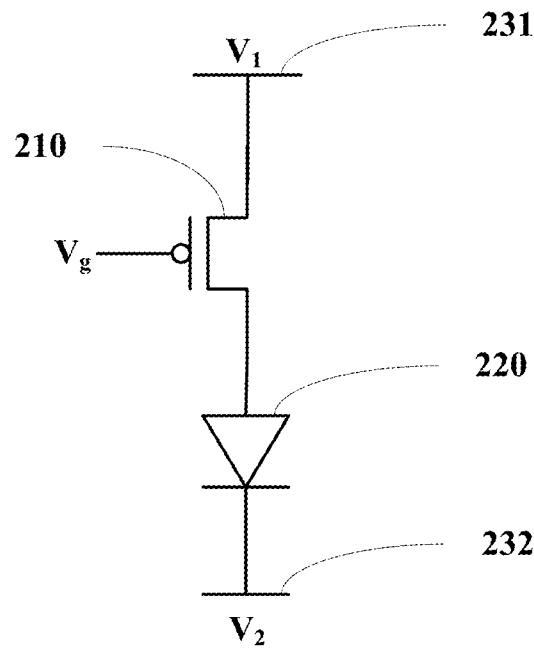
FIG. 2A is a schematic diagram showing a connection between a light emitting device and a driving thin film transistor according to an embodiment of the present disclosure.

FIG. 2A is a schematic diagram showing a connection between a light emitting device and a driving thin film transistor according to an embodiment of the present disclosure.

As shown in FIG. 2A, a driving thin film transistor (DTFT for short) 210 is connected in series to a light emitting device (for example, an OLED device) 220. For example, the driving transistor 210 may be a PMOS (P-channel Metal Oxide Semiconductor) transistor. A first electrode (for example, a source) of the driving thin film transistor 210 is electrically connected to a first voltage terminal 231 for providing a first voltage $V_1$. A second electrode (for example, a drain) of the driving thin film transistor 210 is electrically connected to a first electrode (for example, an anode) of the light emitting device 220. A gate of the driving thin film transistor 210 is configured to receive a gate voltage $V_g$. A second electrode (for example, a cathode) of the light emitting device 220 is electrically connected to a second voltage terminal 232 for providing a second voltage $V_2$. The first voltage $V_1$ is higher than the second voltage $V_2$ in a case where the driving thin film transistor is the PMOS transistor. For example, the first voltage $V_1$ is a high level and the second voltage $V_2$ is a low level. In this embodiment, if current flowing through the light emitting device needs to be increased, a gate-source voltage difference $V_{gs}$ of the DTFT needs to be increased. Therefore, the large current applied to the light emitting device 220 is provided by the DTFT 210 with a large gate-source voltage difference.

Figure 2B:
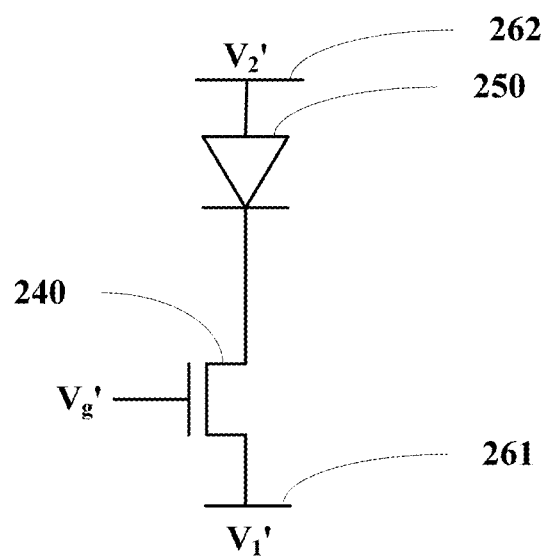
FIG. 2B is a schematic diagram showing a connection between a light emitting device and a driving thin film transistor according to another embodiment of the present disclosure.

FIG. 2B is a schematic diagram showing a connection between a light emitting device and a driving thin film transistor according to another embodiment of the present disclosure.

For example, as shown in FIG. 2B, the driving transistor 240 may be an NMOS (N-channel Metal Oxide Semiconductor) transistor. A first electrode (for example, a source) of the driving thin film transistor 240 is electrically connected to a first voltage terminal 261 for providing a first voltage $V_1'$. A second electrode (for example, a drain) of the driving thin film transistor 240 is electrically connected to a first electrode (for example, a cathode) of the light emitting device 250. A gate of the driving thin film transistor 240 is configured to receive a gate voltage $V_g'$. A second electrode (for example, an anode) of the light emitting device 250 is electrically connected to a second voltage terminal 262 for providing a second voltage $V_2'$. The first voltage $V_1'$ is lower than the second voltage $V_2'$ in a case where the driving thin film transistor is the NMOS transistor. For example, the first voltage $V_1'$ is a low level and the second voltage $V_2'$ is a high level. In this embodiment, if current flowing through the light emitting device needs to be increased, a gate-source voltage difference $V_{gs}'$ of the DTFT needs to be increased. Therefore, the large current applied to the light emitting device 250 is provided by the DTFT 240 with a large gate-source voltage difference.

Figure 2C:
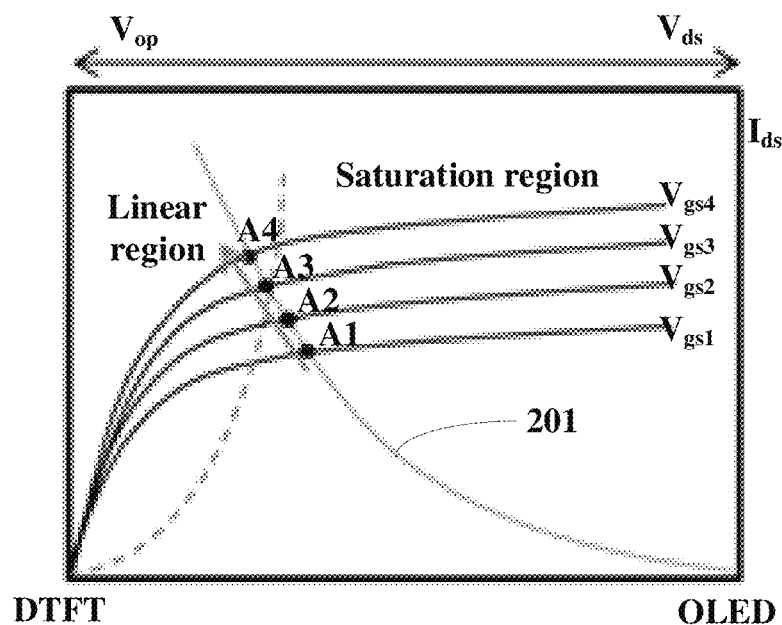
FIG. 2C shows current-voltage characteristic curves of a driving thin film transistor and an OLED device according to some embodiments of the present disclosure.

FIG. 2C shows current-voltage characteristic curves of a driving thin film transistor and an OLED device according to some embodiments of the present disclosure. Here, a P-type driving thin film transistor is taken as an example for description. In FIG. 2C, the ordinate represents current, for example, a drain-source current $I_{ds}$ of the DTFT. Since the DTFT is connected in series to the OLED device, the drain-source current $I_{ds}$ also flows through the OLED device. The abscissa represents voltage (for example, a drain-source voltage $V_{ds}$ of the DTFT and a voltage $V_{op}$ across the OLED device). FIG. 2C shows current-voltage characteristic curves of the DTFT under different gate-source voltages $V_{gs}$. For example, FIG. 2C shows current-voltage characteristic curves of the DTFT under $V_{gs1}$=−4V, $V_{gs2}$=−5V, $V_{gs3}$=−6V, and $V_{gs4}$=−7V, respectively. FIG. 2C also shows a current-voltage characteristic curve 201 of the OLED device. A display substrate (for example, a display substrate for an AMOLED panel) operates at the intersection (point A) of the current-voltage characteristic curve of the DTFT and the current-voltage characteristic curve of the OLED device. If the current flowing through the OLED device needs to be increased, the absolute value of the voltage $V_{gs}$ needs to be increased, so that the operating point of the display substrate is changed from the point A1 to the point Ai (i=2, 3, 4 . . . ). It should be noted that, when the OLED operates normally, the DTFT operates in a saturation region, but in the L-Aging process, the DTFT may operate in the linear region.

Figure 2D:
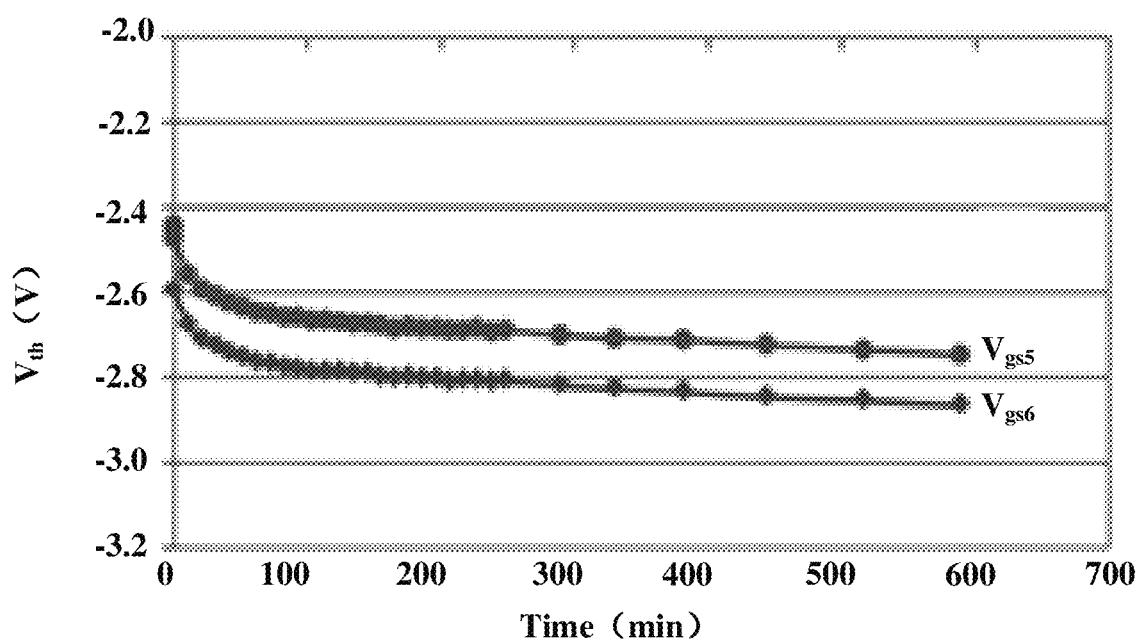
FIG. 2D shows variation curves of a threshold voltage $V_{th}$ of a driving thin film transistor with an increase in operating time under different gate-source voltages $V_{gs}$ according to some embodiments of the present disclosure.

FIG. 2D shows variation curves of a threshold voltage $V_{th}$ of a driving thin film transistor with an increase in operating time under different gate-source voltages $V_{gs}$ according to some embodiments of the present disclosure. Here, a P-type driving thin film transistor is taken as an example for description. For example, $V_{gs5}=-8V$ and $V_{gs6}=-12V$. As shown in FIG. 2D, the larger the absolute value of the gate-source voltage $V_{gs}$ is, the more serious the drift of the threshold voltage $V_{th}$ of the DTFT is, such as the more serious the negative drift.

Figure 2E:
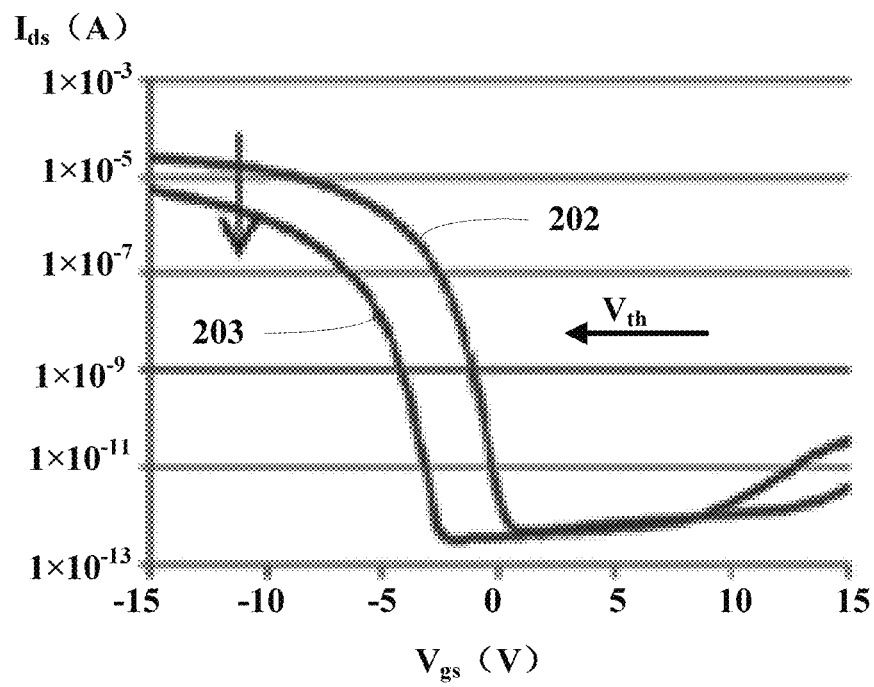
FIG. 2E shows $I_{ds}$–$V_{gs}$ characteristic curves of a driving thin film transistor before and after a lifetime aging process according to some embodiments of the present disclosure.

FIG. 2E shows $I_{ds}$-$V_{gs}$ (i.e., drain-source current vs. gate-source voltage) characteristic curves of a driving thin film transistor before and after a lifetime aging process according to some embodiments of the present disclosure. As shown in FIG. 2E, a curve 202 is the $I_{ds}$-$V_{gs}$ characteristic curve of the driving thin film transistor before the lifetime aging process (that is, no lifetime aging process is performed); a curve 203 is the $I_{ds}$-$V_{gs}$ characteristic curve of the driving thin film transistor after the lifetime aging process. It can be seen from FIG. 2E that after the lifetime aging process, the characteristic curve of the driving thin film transistor has drifted. For example, the threshold voltage of the driving thin film transistor shifts left, which causes the current $I_{ds}$ to decrease. Since the brightness of the light emitting device (such as an OLED device) is positively related to the current $I_{ds}$, a decrease in the current $I_{ds}$ causes a decrease in the brightness of the display substrate (for example, a display substrate for an AMOLED panel), thereby affecting product performance.

Therefore, it can be seen from FIGS. 2A to 2E that, for example, for a P-type thin film transistor, the larger the absolute value of the difference $V_{gs}$ between the gate voltage and the source voltage is, the more serious the negative drift of the DTFT threshold voltage $V_{th}$ is. This will cause the output current of the DTFT to decrease, which may cause the brightness of the light emitting device (such as the OLED device) to decrease, thereby affecting the user experience.

In view of this, embodiments of the present disclosure provide a manufacturing method for a display substrate to reduce the problem of threshold voltage drift of the DTFT.

The display substrate comprises at least one light emitting device. The manufacturing method comprises: applying an electrical signal to the display substrate to generate aging current flowing through the light emitting device; and applying a magnetic field to the display substrate for at least part of a time during which the electrical signal is applied to the display substrate. The magnetic field is used to increase the aging current. In the embodiment, the magnetic field is further applied to the display substrate during the process of applying the electrical signal to the display substrate. This magnetic field contributes to increase the aging current. This may reduce the applied electrical signal (for example, less than an electrical signal applied in the related art), thereby reducing the problem of threshold voltage drift of the driving thin film transistor.

Figure 3:
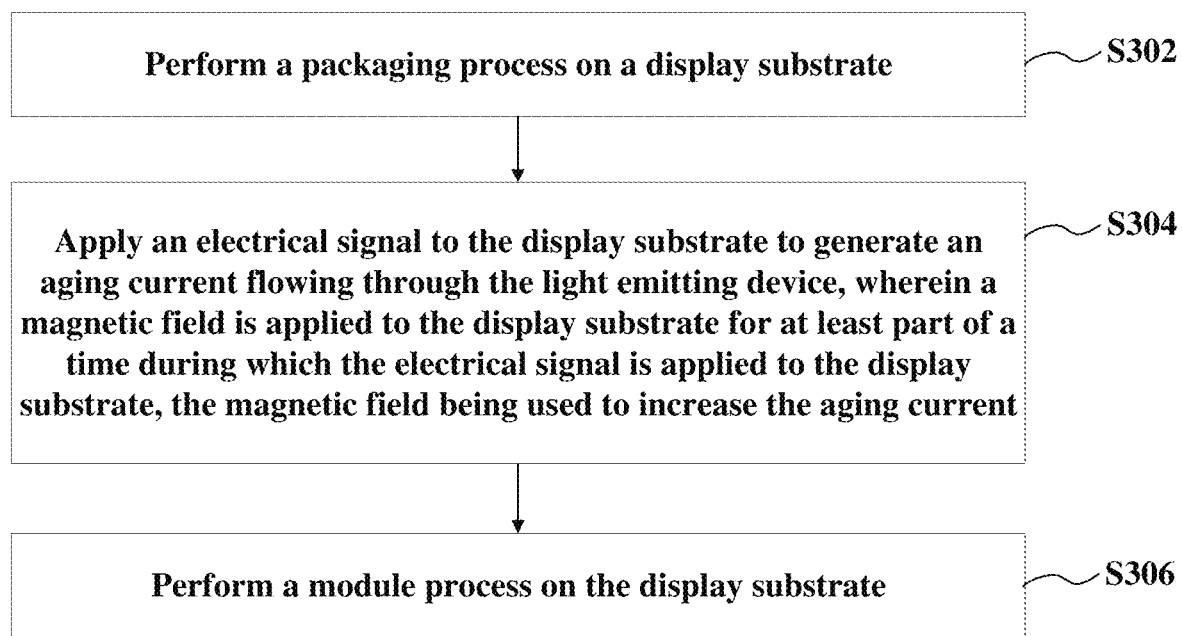
FIG. 3 is a flowchart showing a manufacturing method for a display substrate according to an embodiment of the present disclosure.

FIG. 3 is a flowchart showing a manufacturing method for a display substrate according to an embodiment of the present disclosure. As shown in FIG. 3, the manufacturing method may comprise steps S302 to S306.

At step S302, a packaging process is performed on a display substrate. The packaging process comprises forming a packaging layer on the display substrate. In some embodiments, before performing the packaging process, the manufacturing method may further comprise: performing a evaporation process on the display substrate. For example, a functional layer, a cathode layer, and the like are formed by the evaporation process.

At step S304, an electrical signal is applied to the display substrate to generate aging current flowing through a light emitting device, wherein a magnetic field is applied to the display substrate for at least part of a time during which the electrical signal is applied to the display substrate. The magnetic field is used to increase the aging current.

The electrical connection relationship between the driving thin film transistor and the light emitting device has been described above. In some embodiments, the step of applying the electrical signal to the display substrate comprises: applying the first voltage to the first voltage terminal, applying the second voltage to the second voltage terminal, and applying the gate voltage to the gate of the driving thin film transistor. For example, the first voltage $V_1$ is applied to the first voltage terminal 231, the second voltage $V_2$ is applied to the second voltage terminal 232, and the gate voltage $V_g$ is applied to the gate of the driving thin film transistor 210, in a case where the driving thin film transistor is the PMOS transistor. For another example, the first voltage $V_1'$ is applied to the first voltage terminal 261, the second voltage $V_2'$ is applied to the second voltage terminal 262, and the gate voltage $V_g'$ is applied to the gate of the driving thin film transistor 240, in a case where the driving thin film transistor is the NMOS transistor.

In some embodiments, an absolute value of a difference between the gate voltage and the first voltage is inversely related to magnetic induction intensity of the magnetic field. That is, the larger the magnetic induction intensity of the magnetic field is, the smaller the absolute value of the difference between the gate voltage and the first voltage is, which may reduce the problem of threshold voltage drift of the driving thin film transistor.

In some embodiments, the absolute value of the difference between the gate voltage and the first voltage ranges from 1V to 10V. For example, the difference (that is, the gate-source voltage) between the gate voltage and the first voltage ranges from −10V to −1V in a case where the driving thin film transistor is the PMOS transistor. For another example, the difference (that is, the gate-source voltage) between the gate voltage and the first voltage ranges from 1V to 10V in a case where the driving thin film transistor is the NMOS transistor.

In some embodiments, the magnetic induction intensity of the magnetic field may range from 20 mT (milli-Tesla) to 400 mT. For example, the magnetic induction intensity of the magnetic field may be 50 mT, 100 mT, 200 mT, 300 mT, or the like.

In some embodiments, a direction of the magnetic field may be perpendicular to a plane on which the display substrate is located. In other embodiments, the direction of the magnetic field may be parallel to the plane on which the display substrate is located. Of course, those skilled in the art can understand that the direction of the magnetic field may also be other directions. For example, the direction of the magnetic field may be neither perpendicular nor parallel to the plane on which the display substrate is located.

Here, the time during which the electrical signal is applied to the display substrate at least partially overlaps with the time during which the magnetic field is applied. For example, in the process of applying the electrical signal to the display substrate to generate the aging current (i.e., performing the lifetime aging process), the magnetic field may be applied to the display substrate in advance, and the electrical signal may be applied to the display substrate when the display substrate is in a magnetic field environment. Alternatively, the magnetic field and the electric signal may be applied to the display substrate at the same time. Alternatively, the electric signal may be applied to the display substrate first, and the magnetic field may be applied to the display substrate during the process of applying the electric signal. In some embodiments, a duration for applying the magnetic field may range from 5 min to 30 min.

At step S306, a module process is performed on the display substrate. For example, the module process comprises: a process of bonding an IC (Integrated Circuit) on the display substrate, and the like.

Heretofore, a manufacturing method for a display substrate according to an embodiment of the present disclosure is provided. In this manufacturing method, after the packaging process is performed on the display substrate and before the module process is performed on the display substrate, the electrical signal is applied to the display substrate with the participation of the magnetic field to perform a lifetime aging process. In this way, the gate-source voltage applied to the driving thin film transistor of the display substrate may be reduced, so that the problem of threshold voltage drift of the driving thin film transistor may be reduced. In this way, the decrease in the output current of the driving thin film transistor and the decrease in the light emitting brightness of the light emitting device caused by the threshold voltage drift may be reduced, so that the user experience may be improved.

In some embodiments, a duration of applying the electrical signal is inversely related to the magnetic induction intensity of the magnetic field. That is, the greater the magnetic induction intensity of the magnetic field is, the shorter the duration of applying the electrical signal is, which may also reduce the problem of threshold voltage drift of the driving thin film transistor.

Here, the duration of applying the electrical signal is substantially equal to a duration of the lifetime aging process. The duration of the lifetime aging process may be set as required. The longer the life aging process is, the more obvious the aging effect is.

The principle of performing the lifetime aging process in a case where the display substrate is placed in the magnetic field environment will be analyzed below with reference to the drawings.

Figure 4:
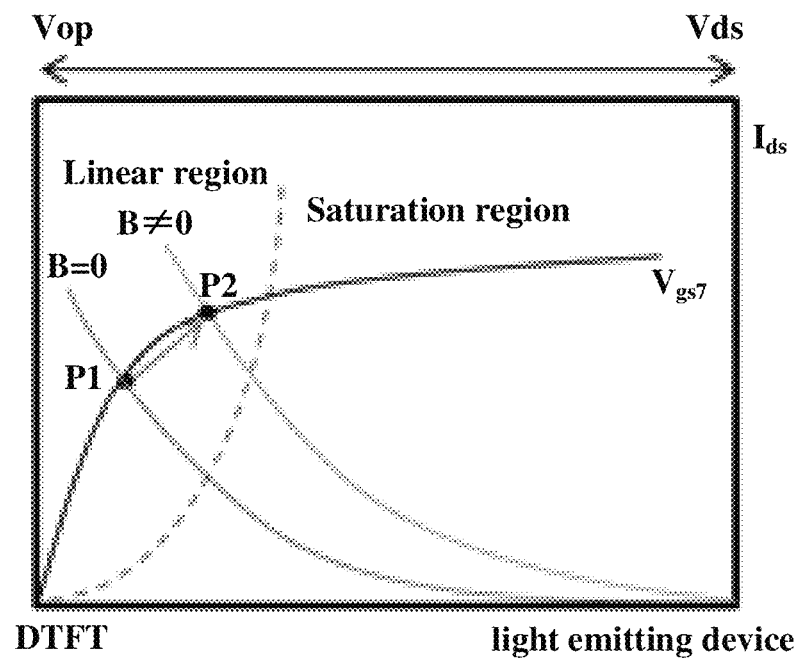
FIG. 4 shows current-voltage characteristic curves of a light emitting device with and without an applied magnetic field according to some embodiments of the present disclosure.

FIG. 4 shows current-voltage characteristic curves of a light emitting device with and without an applied magnetic field according to some embodiments of the present disclosure. FIG. 4 shows a current-voltage (I-V) characteristic curve of the light emitting device (such as an OLED device) when the magnetic field is not applied (i.e., B=0), and a current-voltage characteristic curve of the light emitting device when the magnetic field is applied (i.e., B≠0). In addition, taking a P-type driving thin film transistor as an example, FIG. 4 also shows a current-voltage characteristic curve of the DTFT in the case of a gate-source voltage $V_{gs7}$ (for example, $V_{gs7}$=−6V).

In the above embodiment, the lifetime aging method is performed in the case where the display substrate is placed in the magnetic field environment. Due to the magnetically induced current characteristics of the OLED device, the I-V characteristic curve of the OLED device will move in a direction of decreasing resistance, as shown in FIG. 4. It can be seen from FIG. 4 that after the magnetic field is applied, the operating point of the display substrate is changed from point P1 to point P2. In this way, without increasing the gate-to-source voltage of the DTFT, the current flowing through the OLED device is increased, thereby satisfying requirements for a large current in the lifetime aging process. In this way, the problem of threshold voltage drift of the DTFT caused by a large gate-source voltage may be reduced.

The inventors of the present disclosure has found that electrons and holes are injected into the light emitting layer from the cathode and anode of the OLED device, respectively, to form singlet excitons (or singlet polaron pairs) S and triplet excitons (or triplet polaron pairs) T. S is more ionic than T, that is, S is more easily decomposed into a free electron and a free hole than T. Therefore, S is more easily dissociated into free charge than T and contributes to the device's conduction current. The singlet exciton S may be converted into the triplet exciton T by crossing between states, thereby changing the number of S and T in the device, resulting in a corresponding change in the current flowing through the OLED device. When the OLED device is driven at a constant voltage and is located in a magnetic field, the T energy level undergoes Zeeman splitting to decompose into three substrates $T_1$, $T_0$ and $T_{-1}$. For these three substrates, only the energy of $T_0$ is similar to that of the singlet exciton S. $T_1$ and $T_0$ differ by one Zeeman energy, and $T_{-1}$ and $T_0$ differ by one Zeeman energy, resulting in energy level barriers between the three substrates. Therefore, Zeeman splitting will suppress the conversion of the singlet exciton S to the triplet exciton T ($T_1$ and $T_{-1}$), and increase the number of the singlet exciton S, so that the number of free charges decomposed from S increases, that is, the conduction current of the device increases. Therefore, when the OLED device is in the magnetic field, the magnetic field will suppress the phenomenon of crossing between states in the device, so that the number of the singlet exciton S will increase, which causes the current flowing through the device to increase accordingly.

Figure 5:
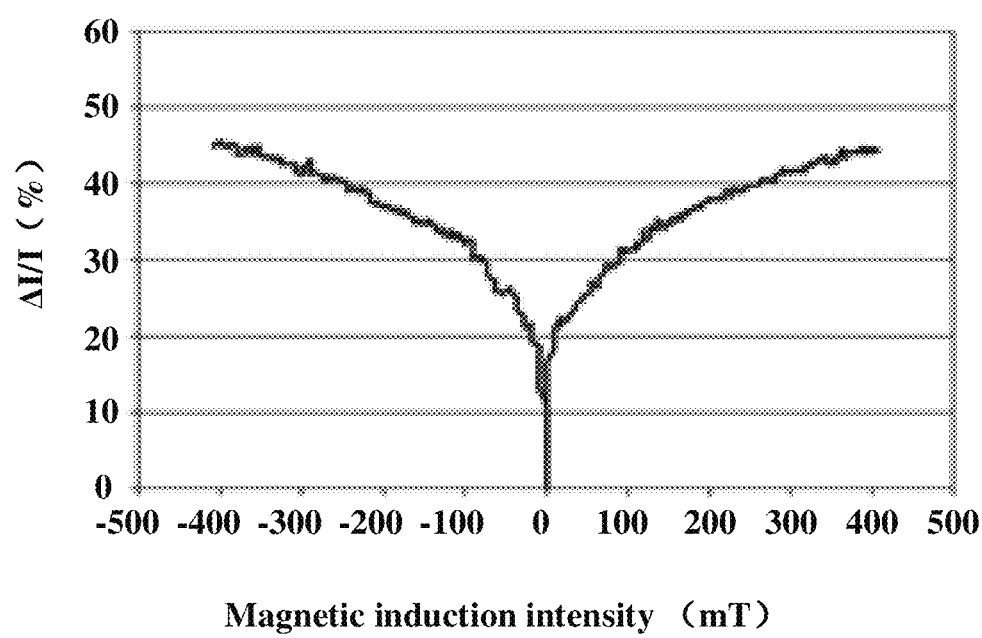
FIG. 5 shows a magnetically induced current change curve of a light emitting device according to an embodiment of the present disclosure.

FIG. 5 shows a magnetically induced current change curve of a light emitting device (for example, an OLED device) according to an embodiment of the present disclosure. As shown in FIG. 5, the abscissa indicates the magnitude of the magnetic induction intensity, wherein the plus and minus signs indicate the direction of the magnetic field respectively. As shown in FIG. 5, the ordinate indicates the relative change amount ($\Delta I/I$) of the current. Here, $\Delta I = I_B - I$, where $I_B$ is the current of the light emitting device after the magnetic field is applied, and I is the current of the light emitting device when the magnetic field is not applied. For example, the magnetically induced current change curve shown in FIG. 5 is a magnetically induced current change curve detected in a case where a voltage of 4V is applied to the light emitting device. When the structure of the light emitting device is fixed and a constant voltage bias is applied to the light emitting device, the magnetically induced current change curve of the light emitting device will be unchanged. As shown in FIG. 5, under the constant voltage, the greater the magnetic induction intensity of the magnetic field applied to the light emitting device is, the larger the current flowing through the light emitting device is.

Figure 6:
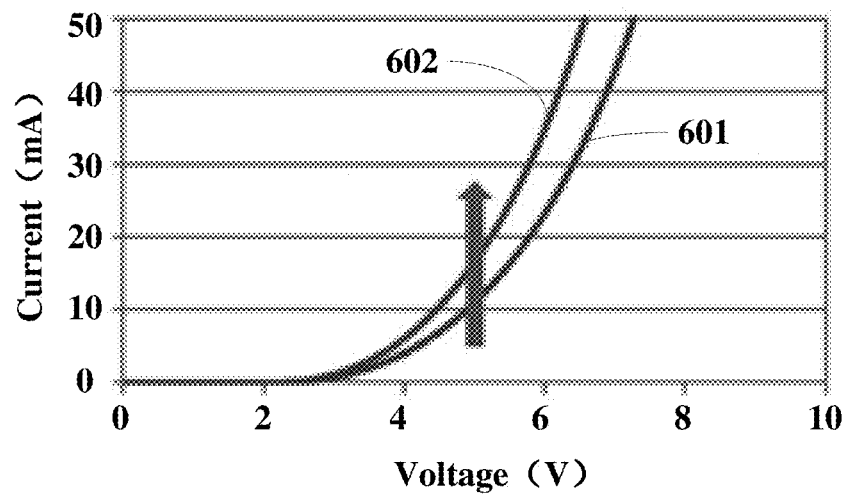
FIG. 6 shows current-voltage characteristic curves of a light emitting device with and without an applied magnetic field according to some embodiments of the present disclosure.

FIG. 6 shows current-voltage (I-V) characteristic curves of a light emitting device with and without an applied magnetic field according to some embodiments of the present disclosure. For example, a curve 601 is a current-voltage characteristic curve of an OLED device when a magnetic field is not applied, and a curve 602 is a current-voltage characteristic curve of the OLED device when the magnetic field is applied (for example, with magnetic induction intensity of 50 mT).

As can be seen from FIG. 6, compared to the case where the magnetic field is not applied, the current-voltage characteristic curve of the OLED device after the magnetic field is applied is shifted in a direction of increase the current. That is, the OLED device behaves as a decrease in resistance of the OLED device in the magnetic field. Therefore, after the magnetic field is applied to the OLED device, the current flowing through the OLED device becomes larger.

In addition, Table 1 may be used to compare the differences in lifetime aging processes with and without the application of a magnetic field. As shown in Table 1, in order to obtain current of 400 mA (that is, the current flowing through the light emitting device) in the lifetime aging process, it is necessary to apply a data voltage of 3.5V to the display substrate in a case where no magnetic field is applied (that is, B=0). The data voltage may be converted into the gate voltage of the DTFT. In order to obtain the current of 400 mA, a data voltage of 2.2 V is applied to the display substrate in a case where a magnetic field (for example, B=50 mT) is applied.

TABLE 1

Lifetime aging process with and without an applied magnetic field

| Current in lifetime aging process (mA) | Intensity of magnetic field (mT) | $V_{data}$ (V) |
|---|---|---|
| 400 | 0 | 3.5 |
| 400 | 50 | 2.2 |

Therefore, in the lifetime aging process, compared with a case where no magnetic field is applied, the application of the magnetic field may reduce the required data voltage, and reduce the required gate-source voltage accordingly.

In other words, when the lifetime aging process is performed on the display substrate (such as a display substrate for an AMOLED panel), the current of the OLED device may be increased by applying the magnetic field without increasing the gate-source voltage of the DTFT, so that the lifetime aging process may be performed on the OLED device with a large current. In addition, corresponding to the structures of different types of light emitting devices (such as OLED devices), different intensities of magnetic fields may be used when the lifetime aging process is performed.

In some embodiments, the applying of the magnetic filed to the display substrate comprises: obtaining magnetic induction intensity of the magnetic field to be applied to the display substrate; and applying the magnetic field to the display substrate according to the magnetic induction intensity.

In some embodiments, the step of obtaining the magnetic induction intensity of the magnetic field may comprise: obtaining a relation curve between the magnetic induction intensity of the magnetic field applied to the light emitting device and current flowing through the light emitting device. For example, the relationship curve between the magnetic induction intensity of the magnetic field applied to the light emitting device of the display substrate and the current flowing through the light emitting device under different voltages (that is, the voltage applied to the light emitting device) may be obtained by testing.

In some embodiments, the step of obtaining the magnetic induction intensity of the magnetic field may further comprise: obtaining the magnetic induction intensity of the magnetic field to be applied to the display substrate according to the relation curve. For example, a range of magnetic induction intensity of the magnetic field that may cause a significant change in the current of the light emitting device may be obtained according to the relation curve, and then an appropriate magnetic induction intensity of a magnetic field may be selected within the range to apply the magnetic field to the display substrate.

In some embodiments of the present disclosure, a processing device (for example, a lifetime aging device) for a display substrate is also provided. The processing device will be described in detail below with reference to the drawings.

Figure 7A:
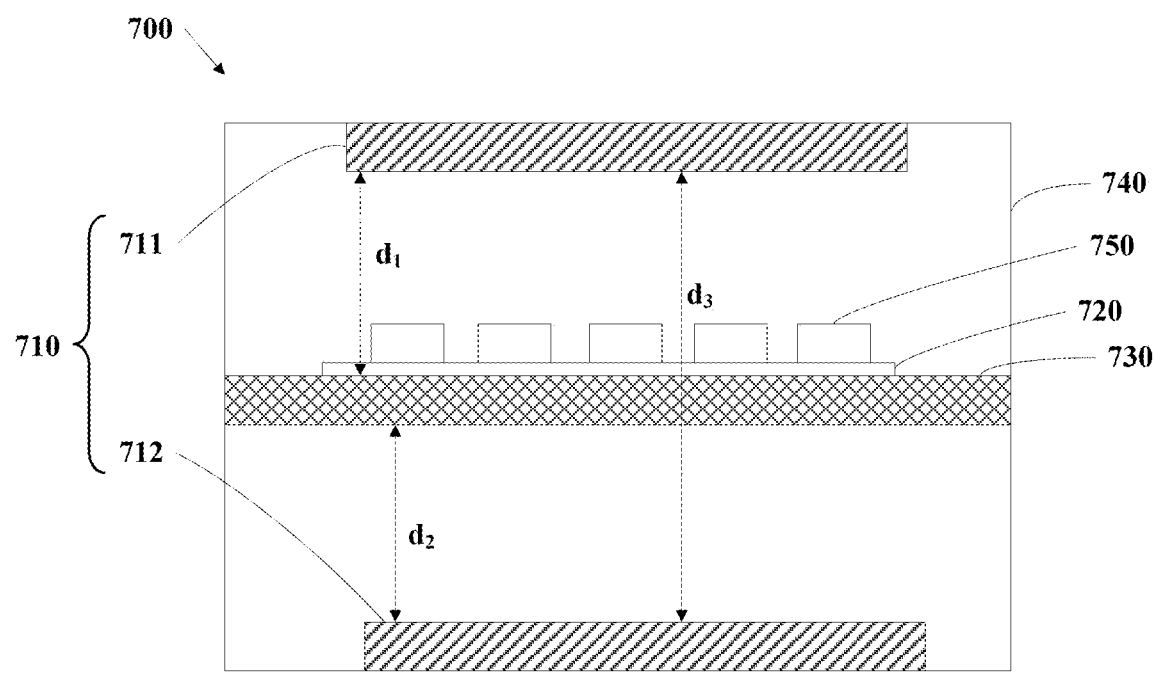
FIG. 7A is a schematic cross-sectional view showing a processing device for a display substrate according to an embodiment of the present disclosure.
Figure 7B:
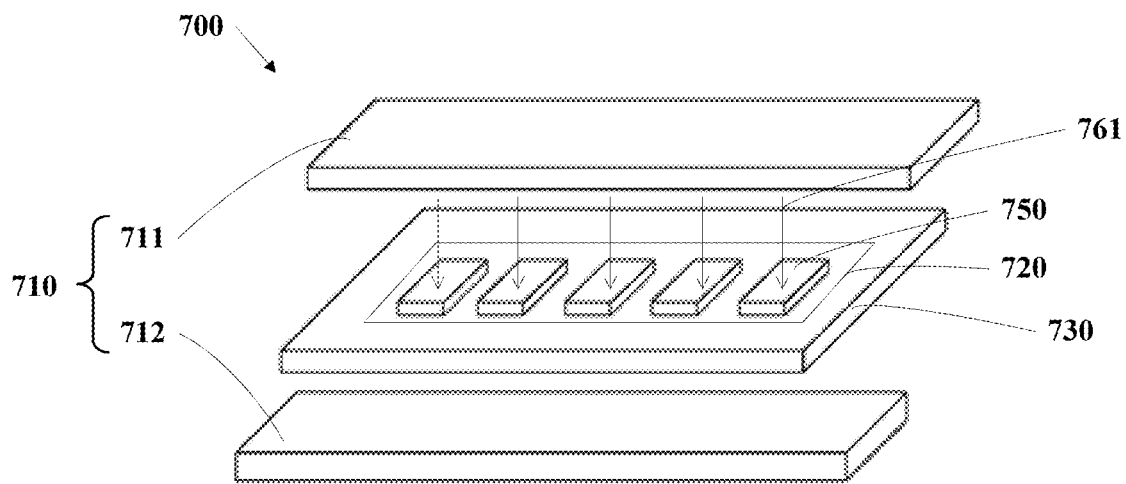
FIG. 7B is a perspective view showing a processing device for a display substrate according to an embodiment of the present disclosure.

FIG. 7A is a schematic cross-sectional view showing a processing device for a display substrate according to an embodiment of the present disclosure. FIG. 7B is a perspective view showing a processing device for a display substrate according to an embodiment of the present disclosure.

As shown in FIGS. 7A and 7B, the processing device 700 comprises a magnetic field generating device 710 and an electric signal applying device 720. In addition, FIGS. 7A and 7B also show at least one display substrate 750. The display substrate 750 comprises at least one light emitting device.

The electric signal applying device 720 is configured to apply an electric signal (such as a voltage signal) to the display substrate 750 to generate aging current flowing through the light emitting device.

The magnetic field generating device 710 is configured to apply a magnetic field to the display substrate 750 for at least part of a time, during which the electrical signal applying device 720 applies the electrical signal to the display substrate 750. The magnetic field is used to increase the aging current.

Here, the display substrate may display different images by applying the electric signal to the display substrate. For example, the display substrate may display a red image when it is required to age OLED devices of red sub-pixels of the display substrate; the display substrate may display a green image when it is required to age OLED devices of green sub-pixels of the display substrate; and the display substrate may display a blue image when it is required to age OLED devices of blue sub-pixels of the display substrate.

Heretofore, the processing device according to some embodiments of the present disclosure is provided. In the processing device, the electrical signal applying device applies the electrical signal to the display substrate to generate the aging current flowing through the light emitting device, and the magnetic field generating device applies the magnetic field to the display substrate for at least part of the time during which the electrical signal applying device applies the electrical signal to the display substrate. The magnetic field is used to increase the aging current. A gate-source voltage applied to a driving thin film transistor of the display substrate may be reduced by using the processing device to performing a lifetime aging process on the display substrate, so that the problem of threshold voltage drift of the driving thin film transistor may be reduced and the user experience may be improved.

In some embodiments, the magnetic field generating device 710 comprises at least one magnetic field device plate for generating the magnetic field. In some embodiments, as shown in FIGS. 7A and 7B, the at least one magnetic field device plate may comprise a first magnetic field device plate 711 and a second magnetic field device plate 712. The electric signal applying device 720 is located between the first magnetic field device plate 711 and the second magnetic field device plate 712. For example, the first magnetic field device plate 711 and the second magnetic field device plate 712 are each in a flat shape.

In some embodiments, as shown in FIGS. 7A and 7B, a plane on which the first magnetic field device plate 711 is located is parallel to a plane on which the second magnetic field device plate 712 is located. This is conducive to generating a uniform magnetic field, and thereby facilitating the control of the lifetime aging process.

In some embodiments, as shown in FIGS. 7A and 7B, the processing device 700 may further comprise a stage 730. The stage 730 is configured to support the display substrate 750. The electric signal applying device 720 is integrated on the stage 730.

In some embodiments, as shown in FIGS. 7A and 7B, the first magnetic field device plate 711 is above the stage 730, and the second magnetic field device plate 712 is below the stage 730. The plane on which the first magnetic field device plate 711 is located is parallel to a plane on which a supporting surface of the stage 730 is located, and the plane on which the second magnetic field device plate 712 is located is parallel to the plane on which the supporting surface of the stage 730 is located. This is conducive to apply a magnetic field perpendicular to the display substrate.

For example, as shown in FIG. 7B, a direction 761 of the magnetic field is perpendicular to a plane on which the display substrate 750 is located. This makes it easier to control the lifetime aging process.

In some embodiments, as shown in FIG. 7A, a distance $d_1$ between the stage 730 and the first magnetic field device plate 711 is equal to a distance $d_2$ between the stage 730 and the second magnetic field device plate 712. In this way, the magnetic field applied to the display substrate may be made as uniform as possible, thereby facilitating the lifetime aging process performed on the display substrate.

In some embodiments, as shown in FIG. 7A, a distance $d_3$ between the first magnetic field device plate 711 and the second magnetic field device plate 712 ranges from 30 cm to 100 cm. For example, the distance between the two magnetic field device plates may be 50 cm, 70 cm, 90 cm, or the like. In the range, it is possible to avoid the contact of the magnetic field device plates with the display substrate as much as possible, and to make the magnetic induction intensity of the magnetic field as large as possible, which is conducive to the implementation of the lifetime aging process.

In some embodiments, the processing device 700 may further comprise robot arms (not shown in the figures) connected to the first magnetic field device plate 711 and the second magnetic field device plate 712 respectively. The distance between the first magnetic field device plate 711 and the second magnetic field device plate 712 may be adjusted by the robot arms.

In some embodiments, as shown in FIG. 7A, the processing device 700 may further comprise a housing 740. The housing 740 encloses the magnetic field generating device 710, the electric signal applying device 720, and the stage 730, and may fix the magnetic field generating device 710 and the stage 730.

Figure 8:
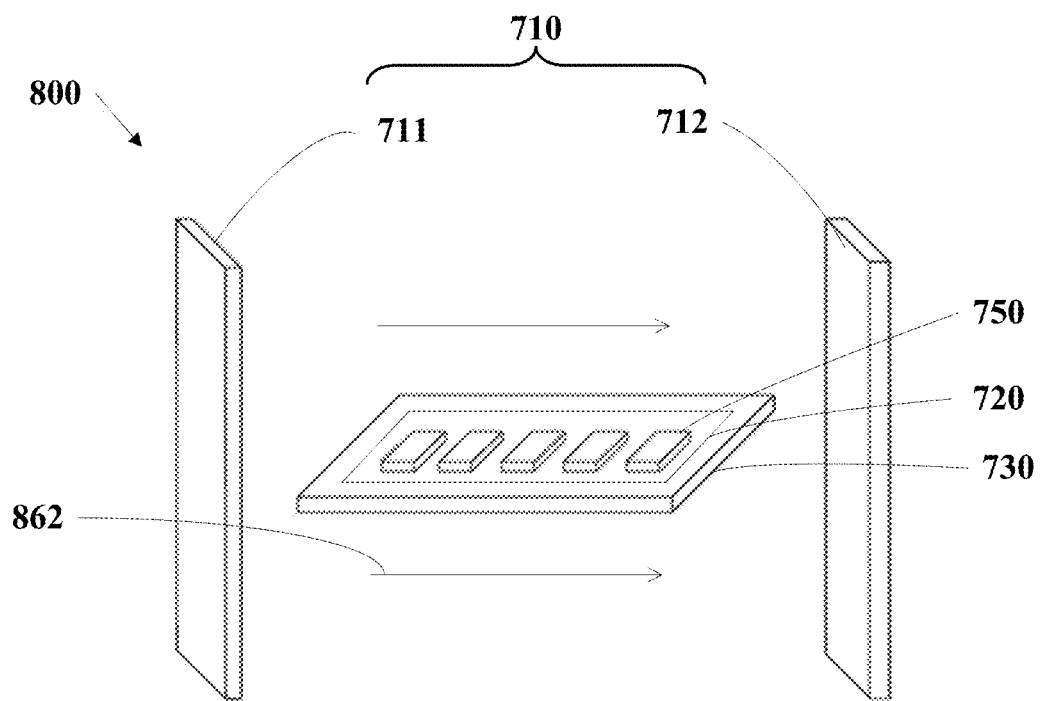
FIG. 8 is a perspective view showing a processing device for a display substrate according to another embodiment of the present disclosure.

FIG. 8 is a perspective view showing a processing device for a display substrate according to another embodiment of the present disclosure.

As shown in FIG. 8, the processing device 800 comprises the magnetic field generating device 710, the electric signal applying device 720, and the stage 730. The magnetic field generating device 710 may comprise at least one magnetic field device plate for generating the magnetic field. For example, the at least one magnetic field device plate may comprise the first magnetic field device plate 711 and the second magnetic field device plate 712. For example, the plane on which the first magnetic field device plate 711 is located is parallel to the plane on which the second magnetic field device plate 712 is located.

In some embodiments, as shown in FIG. 8, the first magnetic field device plate 711 is on a left side of the stage 730, and the second magnetic field device plate 712 is on a right side of the stage 730. The plane on which the first magnetic field device plate 711 is located is perpendicular to a plane on which a supporting surface of the stage 730 is located, and the plane on which the second magnetic field device plate 712 is located is perpendicular to the plane on which the supporting surface of the stage 730 is located.

In some embodiments, as shown in FIG. 8, a direction 862 of the magnetic field is parallel to a plane on which the display substrate 750 is located. This makes it easier to control the lifetime aging process.

It should be noted that although it is described above that the direction of the magnetic field is perpendicular or parallel to the plane on which the display substrate is located, the scope of embodiments of the present disclosure is not limited thereto. For example, the direction of the magnetic field may be any direction other than the above two directions, that is, the direction of the magnetic field may be neither perpendicular nor parallel to the plane on which the display substrate is located.

Figure 9:
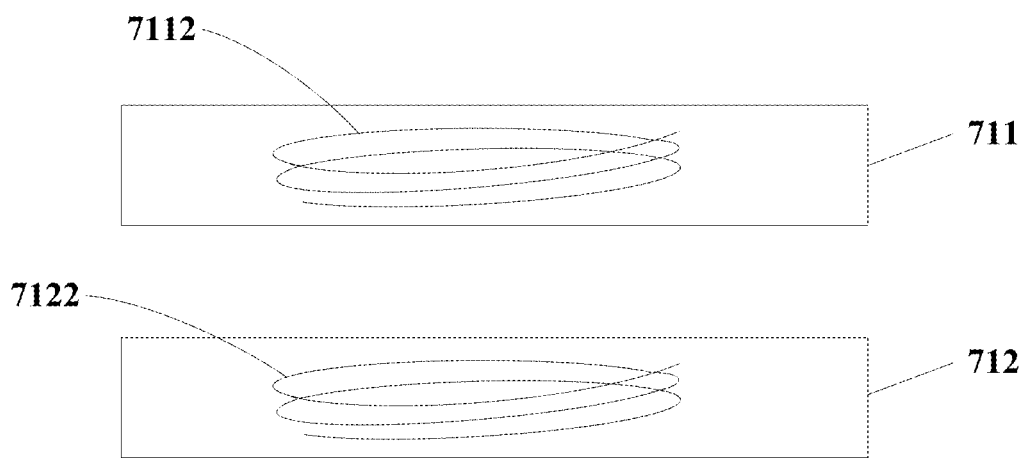
FIG. 9 is a schematic structural diagram showing a magnetic field generating device according to an embodiment of the present disclosure.

FIG. 9 is a schematic structural diagram showing a magnetic field generating device according to an embodiment of the present disclosure.

As shown in FIG. 9, the first magnetic field device plate 711 may comprise a first coil 7112, and the second magnetic field device plate 712 may comprise a second coil 7122. The first coil 7112 and the second coil 7122 may generate the magnetic field (for example, a uniform magnetic field) after being energized. For example, the two coils may be Helmholtz coils. For example, currents having the same direction and the same magnitude may be fed to the first coil and the second coil, respectively.

In some embodiments, the magnetic field generating device 710 is configured to adjust the magnetic induction intensity of the magnetic field applied to the display substrate by adjusting a magnitude of current flowing through the first coil 711 and a magnitude of current flowing through the second coil 712. In this way, the magnetic field generating device may apply magnetic fields with different magnetic induction intensity to the display substrate.

In other embodiments, the first magnetic field device plate and the second magnetic field device plate may each comprise a permanent magnet, which may also generate the magnetic field used in the lifetime aging process.

Heretofore, various embodiments of the present disclosure have been described in detail. In order to avoid obscuring the concepts of the present disclosure, some details known in the art are not described. Based on the above description, those skilled in the art can understand how to implement the technical solutions disclosed herein.

Although some specific embodiments of the present disclosure have been described in detail by way of example, those skilled in the art should understand that the above examples are only for the purpose of illustration and are not intended to limit the scope of the present disclosure. It should be understood by those skilled in the art that the above embodiments may be modified or equivalently substituted for part of the technical features without departing from the scope and spirit of the present disclosure. The scope of the disclosure is defined by the following claims.

What is claimed is:

1. A processing device for a display substrate, the display substrate comprising a light emitting device, and the processing device comprising:

an electric signal applying device configured to apply an electrical signal to the display substrate to generate aging current flowing through the light emitting device; and a magnetic field generating device configured to apply a magnetic field to the display substrate for at least part of a time, during which the electrical signal applying device applies the electrical signal to the display substrate, the magnetic field being used to increase the aging current;

wherein a duration of applying the electrical signal is inversely related to magnetic induction intensity of the magnetic field.

2. The processing device according to claim 1, wherein the magnetic field generating device comprises at least one magnetic field device plate for generating the magnetic field.

3. The processing device according to claim 2, wherein the at least one magnetic field device plate comprise a first magnetic field device plate and a second magnetic field device plate, the electric signal applying device being located between the first magnetic field device plate and the second magnetic field device plate.

4. The processing device according to claim 3, wherein the first magnetic field device plate comprises a first coil, and the second magnetic field device plate comprises a second coil; and the first coil and the second coil generate the magnetic field after being energized.

5. The processing device according to claim 4, wherein the magnetic field generating device is configured to adjust magnetic induction intensity of the magnetic field applied to the display substrate by adjusting a magnitude of current flowing through the first coil and a magnitude of current flowing through the second coil.

6. The processing device according to claim 3, wherein a plane on which the first magnetic field device plate is located is parallel to a plane on which the second magnetic field device plate is located.

7. The processing device according to claim 6, wherein a distance between the first magnetic field device plate and the second magnetic field device plate ranges from 30 cm to 100 cm.

8. The processing device according to claim 1, further comprising:

a stage configured to support the display substrate, wherein the electrical signal applying device is integrated on the stage.

9. The processing device according to claim 8, wherein the first magnetic field device plate is above the stage, and the second magnetic field device plate is below the stage;

a plane on which the first magnetic field device plate is located is parallel to a plane on which a supporting surface of the stage is located, and a plane on which the second magnetic field device plate is located is parallel to the plane on which the supporting surface of the stage is located.

10. The processing device according to claim 8, wherein the first magnetic field device plate is on a left side of the stage, and the second magnetic field device plate is on a right side of the stage;

a plane on which the first magnetic field device plate is located is perpendicular to a plane on which a supporting surface of the stage is located, and a plane on which the second magnetic field device plate is located is perpendicular to a plane on which the supporting surface of the stage is located.

11. The processing device according to claim 8, wherein a distance between the stage and the first magnetic field device plate is equal to a distance between the stage and the second magnetic field device plate.

12. A manufacturing method for a display substrate, the display substrate comprising a light emitting device, and the manufacturing method comprising:

applying an electrical signal to the display substrate to generate aging current flowing through the light emitting device; and applying a magnetic field to the display substrate for at least part of a time, during which the electrical signal is applied to the display substrate, the magnetic field being used to increase the aging current;

wherein a duration of applying the electrical signal is inversely related to magnetic induction intensity of the magnetic field.

13. The manufacturing method according to claim 12, wherein magnetic induction intensity of the magnetic field ranges from 20 mT to 400 mT.

14. The manufacturing method according to claim 12, wherein the applying of the magnetic field to the display substrate comprises:

obtaining magnetic induction intensity of the magnetic field to be applied to the display substrate; and applying the magnetic field to the display substrate according to the magnetic induction intensity.

15. The manufacturing method according to claim 14, wherein the obtaining of the magnetic induction intensity of the magnetic field to be applied to the display substrate comprises:

obtaining a relation curve between the magnetic induction intensity of the magnetic field to be applied to the light emitting device and current flowing through the light emitting device; and obtaining the magnetic induction intensity of the magnetic field to be applied to the display substrate according to the relation curve.

16. The manufacturing method according to claim 12, wherein:

the display substrate further comprises a driving thin film transistor, a first electrode of the driving thin film transistor being electrically connected to a first voltage terminal for providing a first voltage, and a second electrode of the driving thin film transistor being electrically connected to a first electrode of the light emitting device, a gate of the driving thin film transistor being configured to receive a gate voltage, and a second electrode of the light emitting device being electrically connected to a second voltage terminal for providing a second voltage;

the applying of the electrical signal to the display substrate comprises: applying the first voltage to the first voltage terminal, applying the second voltage to the second voltage terminal, and applying the gate voltage to the gate of the driving thin film transistor; and an absolute value of a difference between the gate voltage and the first voltage is inversely related to magnetic induction intensity of the magnetic field.

17. The manufacturing method according to claim 16, wherein:

the first voltage is higher than the second voltage in a case where the driving thin film transistor is a PMOS transistor; and the first voltage is lower than the second voltage in a case where the driving thin film transistor is an NMOS transistor.

18. The manufacturing method according to claim 16, wherein the absolute value of the difference between the gate voltage and the first voltage ranges from 1V to 10V.

19. The manufacturing method according to claim 12, further comprising:

performing a packaging process on the display substrate before applying the electrical signal to the display substrate; and performing a module process on the display substrate after applying the electrical signal to the display substrate.

* * * * *